United States Patent
Rogalli et al.

(10) Patent No.: US 6,958,256 B2
(45) Date of Patent: Oct. 25, 2005

(54) PROCESS FOR THE BACK-SURFACE GRINDING OF WAFERS

(75) Inventors: Michael Rogalli, Rottenburg (DE); Manfred Schneegans, Vaterstetten (DE)

(73) Assignee: Infineon Technologies AG, München (DE)

( * ) Notice: Subject to any disclaimer, the term of this patent is extended or adjusted under 35 U.S.C. 154(b) by 56 days.

(21) Appl. No.: 10/696,866

(22) Filed: Oct. 30, 2003

(65) Prior Publication Data

US 2004/0147120 A1 Jul. 29, 2004

Related U.S. Application Data

(63) Continuation of application No. PCT/EP02/04776, filed on Apr. 30, 2002.

(30) Foreign Application Priority Data

May 3, 2001 (DE) ................................ 101 21 556

(51) Int. Cl.$^7$ ............................................ H01L 21/00
(52) U.S. Cl. ............................ 438/69; 438/51; 438/54
(58) Field of Search ........................... 438/69, 51, 54, 438/70, 64; 156/229, 64, 248, 297; 428/343, 428/345, 355

(56) References Cited

U.S. PATENT DOCUMENTS

| | | | |
|---|---|---|---|
| 5,110,388 A | | 5/1992 | Komiyama et al. |
| 5,366,573 A | | 11/1994 | Bayer et al. |
| 5,637,395 A | * | 6/1997 | Uemura et al. ............. 428/343 |
| 5,639,811 A | | 6/1997 | Plamthottam et al. |
| 5,714,029 A | * | 2/1998 | Uemura et al. ........... 156/275.5 |
| 5,851,664 A | * | 12/1998 | Bennett et al. ........ 428/355 BL |
| 6,010,782 A | * | 1/2000 | Uemura et al. ............. 428/343 |
| 6,048,749 A | | 4/2000 | Yamada |
| 6,235,387 B1 | * | 5/2001 | Bennett et al. ........ 428/355 AC |
| 6,478,918 B2 | * | 11/2002 | Bennett et al. .............. 156/248 |
| 6,524,881 B1 | * | 2/2003 | Tandy et al. ................... 438/69 |
| 6,753,614 B2 | * | 6/2004 | Yamazaki et al. ........... 257/782 |
| 6,793,762 B1 | * | 9/2004 | Kondo et al. ................ 156/297 |

FOREIGN PATENT DOCUMENTS

| | | | |
|---|---|---|---|
| EP | 0 359 373 A2 | 3/1990 | |
| EP | 0359373 A2 * | 3/1990 | ............. C09J 7/02 |
| EP | 0 926 732 A2 | 6/1999 | |
| EP | 0 981 156 A2 | 2/2000 | |
| EP | 1 002 845 A2 | 5/2000 | |
| JP | 8-053655 | 2/1996 | |
| JP | 9-100450 | 4/1997 | |
| JP | 11-140397 | 5/1999 | |
| JP | 2000-223453 | 8/2000 | |
| WO | WO 92/15394 | 9/1992 | |
| WO | WO 96/21704 | 7/1996 | |
| WO | WO 98/49723 | 11/1998 | |
| WO | WO 99/50902 | 10/1999 | |

* cited by examiner

*Primary Examiner*—Laura M Schillinger
(74) *Attorney, Agent, or Firm*—Jenkins, Wilson & Taylor, P.A.

(57) ABSTRACT

The present invention relates to a process for the back-surface grinding of wafers using films which have a support layer, which is known per se, and an adhesion layer which can be polymerized in steps, and to films which include such an adhesion layer which can be polymerized in steps, and to the use thereof.

17 Claims, 1 Drawing Sheet

PROCESS FOR THE BACK-SURFACE GRINDING OF WAFERS

RELATED APPLICATIONS

This application is a continuation of PCT patent application number PCT/EP02/04776, filed Apr. 30, 2002, which claims priority to German patent application number 10121556.8, filed May 3, 2001, the disclosures of each of which are incorporated herein by reference in their entirety.

TECHNICAL FIELD

The present invention relates to a process for the back-surface grinding of wafers using films which have a support layer, which is known per se, and an adhesion layer which can be polymerized in steps, and to films which include such an adhesion layer which can be polymerized in steps, and to the use thereof.

BACKGROUND ART

Currently, during the back-surface grinding of semi-conductor wafers, protective films are adhesively bonded to the wafer front surface, and the wafer which has been covered in this way is placed, by means of the applied film, onto a flat base, and then the wafer back surface is ground, typically using a diamond abrasive. The protective films which have been adhesively bonded to the semiconductor wafer front surface for back-surface grinding can currently only compensate for and planarize topography differences on wafer front surfaces of at most 150 µm. However, new types of mounting processes will in future require contact bumps with a height of up to 250 µm and a diameter of 300–500 µm on wafer front surfaces, instead of the gold or aluminum wire bonds which have hitherto been customary, in order to make contact with printed circuit boards, boards and the like. These high bumps can no longer be covered in a planarizing fashion by the grinding films which are currently employed. The conventional films are no longer able to compensate for these differences in topography, and consequently contact with the substrate surface is not complete, and in particular the film rear side, which rests on the base during grinding of the wafer back surface, is no longer planar, but rather has undulations. The grinding process then leads to local fluctuations in thickness (dimples) in the thinned wafers, which may cause the wafer to break.

The grinding films which are currently used are always composed of a support material (layer thickness 80–200 µm) and an adhesion film with a layer thickness of 10–30 µm. Films of this type are available, for example, from the companies Nitto, Adwill, Mitsui and are currently used for wafer processes. The adhesive film is polymerized in such a way that it has viscoelastic properties. As a result, it is possible to a certain extent to level out differences in topography, and the pulling of the protective film off the semiconductor wafer which is required after grinding takes place substantially without any residues of adhesive remaining on the substrate surface. However, a condition for this is for the contact bumps on the wafer front surfaces to be no more than 150 µm high. If the contact bumps are larger than this, the drawbacks which have been described above occur. Hitherto, there have been no leveling protective films which allow the back-surface grinding of wafers with larger contact bumps. A technical solution for the back-surface grinding of wafers with bumps which are 200 µm high is not currently known.

Furthermore, it is known to apply films to wafers which include a photopolymerizable substance in the adhesion layer, the adhesion layer being viscoelastic and being fully polymerized by the UV radiation. Films of this type are available, for example, from Nitto, Adwill, Mitsui and are currently in use for wafer processes. This process is likewise not suitable for the back-surface grinding of wafers which on their front surface have contact bumps or other structures with a height of more than 150 µm, since in this case too the abovementioned drawbacks occur.

EP 926 732 describes a process for producing semiconductor devices in which a a [sic] pressure-sensitive adhesive tape is applied to a wafer, the tape is heated or pressed on, and then photochemical polymerization takes place after back-surface grinding of the wafer.

U.S. Pat. No. 5,110,388 describes a process for securing chips by means of a photopolymerizable adhesive tape.

JP 9100450 A (abstract) discloses an adhesive tape having a base layer and an adhesion layer, which includes a radiation-curable component and a thermally curable adhesive component. The adhesive tapes can be used to secure wafers when chips are being formed therefrom.

JP 08054655 A discloses an adhesive tape having a curable, pressure-sensitive adhesion layer, containing a component which can be cured by actinic radiation and a thermally curable component.

JP 11140397 A discloses an adhesive tape which includes a radiation-curable component and a thermally curable component, and its suitability for protection from heat and moisture.

JP 2000223453 A has described a radiation-curable protective adhesive tape which includes two different radiation-curable components.

EP 981 156 A2 describes a process for back-surface grinding of wafers, in which a protective adhesive tape, which has a modulus of elasticity of at least $1.0 \times 10^6$ Pa at 40° C., is applied to the wafer front surface.

SUMMARY OF THE INVENTION

It is an object of the present invention to provide a process and a film with which the abovementioned drawbacks during the back-surface grinding of semiconductor wafers do not occur. According to the invention, this is achieved by a process according to Claim 1 and a film according to Claim 6. Further and preferred embodiments will emerge from the subclaims and the following description. Claim 1 provides a process for the back-surface grinding of wafers, comprising the following steps:

a) applying a film, which has a support layer and an adhesion layer, by means of the adhesion-layer side, to the wafer front surface, the film being applied to the wafer front surface by lamination, the adhesion layer matching the semiconductor topography structures and/or the contact bumps on the wafer surface, while the support layer, on the rear side, runs plane-parallel to the wafer surface;

b) carrying out a first photochemically initiated partial polymerization in the adhesion layer, with the result that the adhesion layer adopts an elastic behavior as a result of the first partial polymerization and the adhesion between adhesion layer and wafer surface is reinforced;

c) grinding the wafer back surface, d) carrying out a second partial polymerization in the adhesion layer, with the result that the adhesion between the adhesion layer and the wafer surface is reduced; and e) pulling the film off the wafer front surface.

Claim 6 provides a film for use in the back-surface grinding of wafers, which has a support layer and an adhesion layer, in which film the adhesion layer can be polymerized in steps and is designed in such a way that, first of all, a photochemically initiated partial polymerization and then a photochemically or thermally initiated partial polymerization can be carried out.

DETAILED DESCRIPTION OF THE INVENTION

In the process according to the present invention for the back-surface grinding of wafers, first of all conventional methods are used to apply a film to the wafer front surface, usually by lamination, i.e. by the film being pressed on mechanically. The film has a support layer and an adhesion layer which can be polymerized in steps. The adhesion layer which can be polymerized in steps is designed in such a way that, first of all, a photochemically initiated partial polymerization and then a photochemically or thermally initiated partial polymerization can be carried out.

The film may usually be present in the form of rolls with a length of 100–200 m and can be produced in dimensions which are suitable for all wafer sizes, for example in widths of 100 mm, 200 mm or 300 mm.

According to the invention, the film has a support layer which is known per se and has a layer thickness of preferably 80–200 $\mu$m. Thermoplastic materials such as polyethylene and other polyolefins are preferably used as the support. PVC is often also used, but this material is being avoided to an increasing extent, owing to the risk of Cl contamination.

According to the invention, the adhesion layer used is a layer which can be polymerized in steps and has a thickness of preferably up to 500 $\mu$m, preferably 150–300 $\mu$m, more preferably 200–300 $\mu$m, and with initialy visco-plastic properties. According to the invention, the adhesion layers include polymers which have already undergone preliminary crosslinking, i.e. prepolymers. The molecular mass distribution is selected in such a way that viscous wetting is possible despite partial crosslinking. According to the invention, the adhesion layer has an initial adhesion (tack) on the surface. According to the invention, when the protective film is being laminated onto the wafer front surface, the contact bumps are embedded into the soft adhesive film without deformation or twisting, so that the support layer which forms the rear surface of the film runs plane-parallel with respect to the wafer surface. This is diagrammatically illustrated in FIG. 1. A wafer (1) which is provided with contact bumps (2) on the front surface is coated with a film (3) which has an adhesion layer (4) and a support layer (5). The rear side of the support layer runs plane-parallel with respect to the wafer surface or wafer back surface.

After the film has been applied to the wafer surface, usually by lamination, a first photochemically initiated partial polymerization of the prepolymers or polymerizable substances contained in the adhesion layer takes place, generally by UV irradiation. The UV irradiation takes place, for example, using standard UV lamps which can be selected according to the photo-initiator used. The degree of polymerization can be controlled by means of the time or intensity of irradiation. In this way, according to the invention, the adhesive which is matched to the wafer surface topography is partially cured, so that it acquires elastic properties. Furthermore, the adhesion between the adhesion layer and the wafer surface is preferably reinforced thereby. There then follows the back-surface grinding of the wafer using processes which are known per se. The front surface of the wafer is placed onto a base which is suitable for grinding, so that the wafer back surface which is to be ground faces upward. During the back-surface grinding with a film which is applied in accordance with the invention, the abrasive forces which occur can be compensated for by the hard-elastic support and the adhesion layer, which is elastic and stronger after the first partial polymerization, substantially without any deformation to the wafer. The film rear side rests on the base in such a manner that it is plane-parallel with respect to the wafer back surface, so that there are substantially no disruptive forces caused by unevenness in the film rear side during the back-surface grinding. Moreover, the wafer topography or the wafer surface structure is completely embedded in the elastic adhesion layer material, so that optimum damping can be achieved.

According to the invention, the back-surface grinding usually takes place using conventional processes, i.e. encompasses, by way of example, the following steps: Placing the laminated side of the wafer onto a vacuum chuck, rotating this chuck and rinsing with water. Placing a rotating diamond abrasive ring onto the exposed back surface of the wafer; advancing the abrasive ring to the desired depth, lifting off the abrasive wheel, rinsing with water, removing the wafer, conveying onward to the next grinding station (finishing), advancing the rotating finishing wheel to the desired depth, lifting off the abrasive wheel, rinsing with water, unloading the thin wafer.

According to the invention, the back-surface grinding is followed by a second partial polymerization of polymers or polymerizable substances which are present in the adhesion layer. This results in deformation of the polymers contained in the adhesion layer to an extent which is such that, as a result, the adhesive forces are reduced compared to before the first partial polymerization, preferably to a level of 10–20%. According to the invention, the second partial polymerization in particular has the effect of reducing the interaction between substrate and applied adhesion layer at the interface between them. As a result, the protective film can be pulled off without damage to the bumps or other semiconductor topography and substantially without any residues of adhesive or without any contamination on the wafer surface. The term "substantially without residues of adhesive" means that, after the protective film has been pulled off, the surface which remains is sufficiently pure for the following applications and/or that no residues of adhesive are then visible under a scanning electron microscope. It is preferable for complete conversion or polymerization of the as yet unpolymerized fraction in the adhesion layer to take place during the second partial polymerization.

The film is usually pulled off by laminating on a very strongly adhesive film strip and mechanically pulling off the strip. In the process, the film strip pulls off the entire tape (protective film) from the wafer surface. The wafer is fixed to a vacuum chuck. According to the invention, there is preferably no further cleaning step. The protective films according to the invention can be pulled off without leaving any residues of adhesive or contamination.

The process according to the invention using a first photochemically initiated partial polymerization has the advantage that the polymerization process can be controlled very successfully during the photochemically initiated partial polymerization. Therefore, the polymerization process can easily be interrupted when the adhesion layer has become elastic. Surprisingly, it has been found that in the process, after the strip has been pulled off following the second polymerization, surfaces which are particularly free of adhesive are obtained and there was substantially no mechanical damage to or fracturing of the wafer. Therefore, the process sequence involved in the processing of wafers can be considerably improved.

In the film according to the invention, the support layer contains polymers which are also used in conventional support layers for grinding films. Polyethylenes and other polyolefins are preferred. According to the invention, the layer thickness of the support layer is preferably 80–200 μm.

It is required of the adhesion layer that selective crosslinking or stepwise crosslinking/polymerization of the prepolymers or polymerizable substances contained therein be possible. According to the invention, this is ensured by chemical hybrid systems. According to the invention, it is possible in principle to distinguish between two forms of such hybrid systems, namely hybrid systems of the first order and hybrid systems of the second order.

According to the invention, it is characteristic of first-order hybrid systems that selective thermal or photochemical crosslinkability is ensured. According to the invention, first of all a photochemical polymerization and then a thermal polymerization may take place. The procedure can therefore be adapted to the corresponding process sequence involved in mounting.

In the case of first-order hybrid systems, stepwise polymerization is possible firstly if the adhesion layer is composed of a prepolymer mixture or a mixture of polymerizable substances which, in addition to a thermally polymerizable fraction also contains a further, photochemically polymerizable fraction.

However, according to the invention, it is also possible for the adhesion layer to contain only one type of polymerizable substance or prepolymer, which can be polymerized selectively and in steps by a combination of thermally and photochemically activatable initiators. This is achieved, for example, using different functional groups which are reacted partly by thermal initiators and partly by photchemical initiators.

According to the invention, acrylates, polyurethanes, epoxides, polyesters and/or polyethers, as well as derivatives and mixtures thereof, are suitable prepolymer constituents of first-order hybrid systems. By way of example, acrylates, preferably multi-functional acrylates, in combination with functional prepolymers are preferred.

A wide range of commercially available products with different backbones, such as acrylates, polyurethanes, epoxides, polyesters and/or polyethers or derivatives thereof are preferably available as functional prepolymers which can be used. The acrylates and other prepolymers preferably have double bonds as functional groups which can be reacted by means of initiators. As different initiators, the first-order chemical hybrid systems preferably include peroxides, preferably benzoyl peroxide or di-tertbutyl peroxide, as thermal initiators and preferably aromatic carbonyl compounds, which undergo Norrish type 1 fragmentation, such as for example benzoin, benzoin derivatives, benzil ketals and/or acetophenone derivatives, as photochemical UV starters. Acylphosphine oxides or alpha-amino ketones are also preferred.

An adhesion-layer composition which is particularly preferred according to the invention is a linear polyester with a triacrylate, preferably trimethylolpropane triacrylate (TMPTA), as multi-functional acrylate as crosslinking constituent in combination with benzoin and benzoyl peroxide. This has given particularly good results in tests.

According to the invention, the amount of photoinitiator preferably varies from 0.3% by weight to 5% by weight, more preferably from 0.3 to 3% by weight, particularly preferably about 2% by weight, and the amount of the thermal starter is preferably from 0.5% by weight to 1.5% by weight, more preferably about 1% by weight.

The quantities of adhesion-layer constituents may vary within wide limits, but according to the invention it is preferable to use standard quantities of constituents, that is to say prepolymers and initiators. The proportions of multifunctional acrylates and polyesters can be varied as desired. The polyester to acrylate ratio in % by weight is preferably about 70–90 to 10–30, preferably about 80 to 20.

According to the invention, the first crosslinking step can be used to set the desired rigidity, strength and elasticity of the adhesion layer for the thin grinding. The second partial polymerization step produces the required reduction in the adhesive force. This sequence can be carried out using any desired thermally and photochemically crosslinkable mixed formulations, so that they correspond to the preassembly requirements. These mixed formulations are preferably transparent.

In second-order hybrid systems, the prepolymers or polymerizable substances which are present in the adhesion layer can be crosslinked exclusively by a photochemical route. The first and second partial polymerizations therefore take place photochemically. The crosslinking takes place in a number of stages, preferably as a result of the films containing different photoinitiators. The different selectivities of the photoinitiators are based on their different wavelength-specific sensitivities. The appropriate initiator is activated according to the wavelength of the incident radiation, thereby effecting the desired partial crosslinking reactions. After the viscous adhesive film has been applied, topography on the wafer surface is compensated for, the first exposure crosslinks and consolidates the adhesive film, and the second irradiation, after the thin grinding, releases the adhesive bond between film and wafer surface. The choice of photoinitiators can be adapted to the manufacturing equipment conditions.

According to the invention, a second-order hybrid system preferably comprises a system in which there is only one prepolymer or polymerizable substance which can be polymerized by a first initiator, it being possible for the polymerization to be stopped by means of the process parameters or to be controlled by quantitative proportions of the initiators, and then a second initiator is activated, in order to start the second partial polymerization.

According to the invention, the second-order hybrid systems may preferably also be a mixture of polymers or polymerizable substances, it being possible for a first polymerizable substance/polymer to be polymerized by a first photoinitiator and for a second polymerizable substance/polymer to be polymerized by a second photo-initiator.

According to the invention, the polymer used in the second-order hybrid systems may be the same polymers as the polymers listed above for the first-order hybrid systems. Naturally, it is a condition that it must be possible for the polymers to be initiated by photo-chemical initiators.

According to the invention, it should be fundamentally be ensured that the first polymerization is not complete. This can be achieved by using the polymerization parameters, for example, in the case of thermal polymerization, by using the duration of the treatment or the temperature employed or, in the case of photochemical polymerization, by using the quantity of initiator and/or the duration of the UV irradiation. Furthermore, according to the invention, control can also be achieved, in the case of a mixture of polymerizable substances or polymers, by means of the quantitative proportions of the photochemically or thermally polymerizable substances or polymers and of the initiators involved.

According to the invention, the adhesion-layer thicknesses may preferably be up to 500 μm. According to the invention, the adhesion layers preferably have a thickness of 150–300 μm, more preferably 200–300 μm. However, according to the invention, thicknesses outside these limits are also possible. According to the invention, the layer thicknesses can be adapted to the substrate which is to be protected during grinding. Suitable proportions can be determined by the person skilled in the art.

The wafers used as substrates consist of silicon, and may have semiconductor structures on them, for example integrated memory, logic, power or individual semi-conductor circuits, and also, in particular, contact bumps. These contact bumps are usually polymers, on which, according to the invention, there may also be metal tracks leading to them. The wafer front surfaces which are to be coated therefore form, for the adhesion layer of the film, a surface of silicon, conductor metals and/or insulating or electrical polymers. According to the invention, the contact bumps on the wafer front surface may preferably have a height of 150–250 μm and a diameter of 300–500 μm.

The films according to the invention may preferably be stored in the form of rolls, preferably with a length of 100 to 200 m. The width of the films can be matched to the diameter of the wafer substrate which is to be coated.

The present invention also encompasses wafers which are coated with the films according to the invention. The invention also encompasses wafers which have been produced using the process according to the invention.

The invention is explained below with reference to exemplary embodiments which, however, are not intended to restrict the scope of the invention.

BRIEF DESCRIPTION OF THE DRAWING

Reference is made to the following FIGURE in the description and the invention.

EXAMPLES

Figure 1:
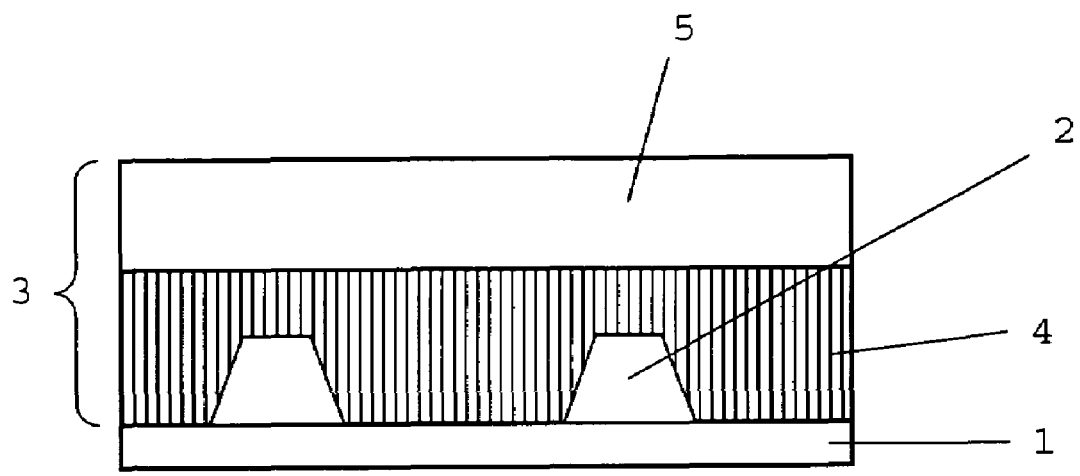
FIG. 1 shows a wafer which has been coated in accordance with the invention and has contact bumps on it.

1. Film with a First-Order Hybrid System

A pressure-exerting roller was used to laminate films onto wafers with a diameter of 200 or 300 mm and integrated circuits and contact bumps with a height of 250 μm (polymer or metal bumps) and a diameter of 400 μm situated thereon. The films had a support layer which was 150 μm thick and comprised polyolefins or PVC. The adhesion layer of the film had the following composition: 77.5% by weight of linear polyesters and 19.5% by weight of a triacrylate (TMPTA) as crosslinking constituent in combination with 2% by weight of benzoin and 1% by weight of benzoylperoxide. The layer thickness of the adhesion layer was 300 μm.

There followed a first photochemically initiated partial polymerization, which was controlled by means of the radiation intensity or time in such a way that the adhesion layer adopted an elastic behavior.

Then, the support rear side was positioned on a rotating vacuum chuck, which is part of the grinding machine, as a base, and the wafer back surface was ground. The following steps were carried out during the grinding: the laminated side of the wafer was placed onto a vacuum chuck, this chuck was rotated and rinsed with water. A rotating diamond abrasive ring was placed onto the exposed back surface of the wafer; the abrasive ring was advanced to the desired depth, the abrasive wheel was lifted off, rinsing was carried out with water, the wafer was removed and was conveyed onward to the next grinding station (finishing), the rotating finishing wheel was advanced to the desired depth, the grinding wheel was lifted off, rinsing was carried out using water and the thin wafer was unloaded.

After the back-surface grinding, a second thermally initiated partial polymerization was carried out by increasing the temperature, so that substantially completed polymerization was achieved. The film was then pulled off the wafer substrate. There was no further cleaning step.

Under a scanning electron microscope, it was impossible to detect any residues of adhesive on the wafer substrate. Repeated tests did not observe any mechanical damage to or fractures of a wafer.

What is claimed is:

1. Process for back-surface grinding of wafers, comprising the following steps:
   a) applying a film, which has a support layer and an adhesion layer, by means of the adhesion-layer side, to the wafer front surface, the film being applied to the wafer front surface by lamination, the adhesion layer matching semiconductor topography structures and/or contact bumps situated on the wafer surface, while the support layer, on the rear side, runs plane-parallel to the wafer surface;
   b) carrying out a first photochemically initiated partial polymerization in the adhesion layer, with the result that the adhesion layer adopts an elastic behavior as a result of the first partial polymerization and the adhesion between adhesion layer and wafer surface is reinforced;
   c) grinding the wafer back surface,
   d) carrying out a second partial polymerization in the adhesion layer, with the result that the adhesion between the adhesion layer and the wafer surface is reduced; and
   e) pulling the film off the wafer front surface.

2. Process according to claim 1, wherein the wafer front surface is provided with semi-conductor structures.

3. Process according to claim 1, wherein the wafer front surface has contact bumps of a height of 150–250 μm and a diameter of 300–500 μm.

4. Process according to claim 1, wherein the second partial polymerization is thermally or photochemically initiated.

5. Process according to claim 1, wherein the support layer rests flat on a base during the back-surface grinding of the wafer.

6. Process according to claim 1, wherein the support layer includes prepolymers which are known per se, preferably polyolefins.

7. Process according to claim 1, wherein the thickness of the support layer is 80–200 μm.

8. Process according to claim 1, wherein the adhesion layer includes a thermally polymerizable prepolymer and a photochemically polymerizable prepolymer.

9. Process according to claim 1, wherein the adhesion layer includes two photochemically polymerizable prepolymers.

10. Process according to claim 1, wherein the adhesion layer includes a prepolymer which can be selectively polymerized by a combination of a thermally activatable initiator and a photochemically activatable initiator.

11. Process according to claim 1, wherein the adhesion layer includes a prepolymer which can be selectively polymerized by a combination of two different photochemically activatable initiators.

12. Process according to claim 1, wherein the adhesion layer includes acrylates, polyurethanes, expoxides, polyesters, polyethers and/or derivatives or mixtures thereof as thermally and/or photochemically polymerizable prepolymers.

13. Process according to claim 1, wherein the adhesion layer includes multifunctional acrylates in combination with functional prepolymers as thermally and/or photochemically polymerizable prepolymers, polymers with different backbones, such as polyurethanes, epoxides, polyesters and/or polyethers or derivatives thereof being present as functional prepolymers and the acrylates having double bonds.

14. Process according to claim 1, wherein the adhesion layer contains peroxides, preferably benzoyl peroxide and/or di-tertbutyl peroxide, as thermal initiator(s).

15. Process according to claim 1, wherein the adhesion layer includes aromatic carbonyl compounds, which undergo a Norrish type 1 rearrangement, preferably benzoin, benzoin derivatives, benzil ketals, acetophenone derivatives and/or acylphosphine oxides or alpha-amino ketones, as photochemical initiator(s).

16. Process according to claim 1, wherein the photoinitiators can be activated at different wavelengths.

17. Process according to claim 1, wherein the adhesion layer has a thickness of up to 500 $\mu$m, preferably 150–300 $\mu$m, more preferably 200–300 $\mu$m.

* * * * *